(12) United States Patent
Haon et al.

(10) Patent No.: US 10,617,001 B2
(45) Date of Patent: Apr. 7, 2020

(54) ELECTRONIC CIRCUIT AND METHOD OF MANUFACTURING THE SAME

(71) Applicant: Commissariat à l'Énergie Atomique et aux Énergies Alternatives, Paris (FR)

(72) Inventors: Olivier Haon, Saint-Etienne-de-Crossey (FR); Abdelkader Aliane, Grenoble (FR); Mohammed Benwadih, Champigny sur Marne (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/817,630

(22) Filed: Nov. 20, 2017

(65) Prior Publication Data
US 2018/0146548 A1 May 24, 2018

(30) Foreign Application Priority Data
Nov. 21, 2016 (FR) ..................................... 16 61302

(51) Int. Cl.
*H05K 1/03* (2006.01)
*H05K 1/09* (2006.01)
*H01L 21/48* (2006.01)
*H05K 3/12* (2006.01)
*H01L 23/14* (2006.01)
*H01L 23/498* (2006.01)

(52) U.S. Cl.
CPC ....... *H05K 1/0353* (2013.01); *H01L 21/4867* (2013.01); *H01L 23/145* (2013.01);
(Continued)

(58) Field of Classification Search
CPC ...... H05K 1/0353; H05K 1/095; H05K 3/125; H05K 3/1208; H05K 2203/013;
(Continued)

(56) References Cited

U.S. PATENT DOCUMENTS

| 9,931,821 B2 * | 4/2018 | Lu .......................... B32B 27/18 |
| 2005/0100719 A1 * | 5/2005 | Kanakarajan ........... B32B 15/08 |
| | | 428/209 |

(Continued)

FOREIGN PATENT DOCUMENTS

| EP | 0 678 918 A2 | 10/1995 |
| KR | 2003006400 | * 1/2003 |
| WO | WO 2014/087882 A1 | 6/2014 |

OTHER PUBLICATIONS

French Search Report for Application No. FR 1661302 dated Jul. 7, 2017.

*Primary Examiner* — Ishwarbhai B Patel
(74) *Attorney, Agent, or Firm* — Wolf, Greenfield & Sacks, P.C.

(57) ABSTRACT

An electronic circuit, including a substrate made of a first polymer having a first glass transition temperature lower than 200° C., the substrate having first and second opposite surfaces; a first layer or first tracks of a second polymer on the first surface; a second layer or second tracks of the second polymer or of a third polymer on the second surface, the second and third polymers being different from the first polymer and having a second glass transition temperature higher than 200° C.; and third electrically-conductive tracks on the first layer or the first tracks.

7 Claims, 3 Drawing Sheets

(52) U.S. Cl.
CPC ............. *H05K 1/095* (2013.01); *H05K 3/125* (2013.01); *H05K 3/1208* (2013.01); *H01L 23/4985* (2013.01); *H05K 1/03* (2013.01); *H05K 1/036* (2013.01); *H05K 1/0313* (2013.01); *H05K 2201/0145* (2013.01); *H05K 2201/0158* (2013.01); *H05K 2201/0195* (2013.01); *H05K 2203/013* (2013.01)

(58) Field of Classification Search
CPC ... H05K 2201/0158; H05K 2201/0145; H05K 1/036; H05K 2201/0195; H01L 21/4867; H01L 23/145; H01L 23/4985
See application file for complete search history.

(56) References Cited

U.S. PATENT DOCUMENTS

| | | | |
|---|---|---|---|
| 2005/0104214 A1* | 5/2005 | Maeda | H01L 23/145 257/747 |
| 2009/0035591 A1* | 2/2009 | Nishikawa | B32B 15/08 428/458 |
| 2010/0078208 A1* | 4/2010 | Inoue | H05K 3/246 174/261 |
| 2010/0078209 A1* | 4/2010 | Inoue | H05K 3/125 174/261 |
| 2010/0196703 A1 | 8/2010 | Matsuura et al. | |
| 2011/0213086 A1* | 9/2011 | Matsui | C08L 67/03 525/189 |
| 2013/0101824 A1* | 4/2013 | Shim | B29C 70/885 428/221 |
| 2013/0105200 A1* | 5/2013 | Ohigashi | C08J 5/24 174/250 |
| 2014/0080306 A1* | 3/2014 | Lu | H01L 21/31058 438/703 |
| 2015/0224742 A1* | 8/2015 | Inoue | B29C 45/14311 428/687 |

* cited by examiner

ELECTRONIC CIRCUIT AND METHOD OF MANUFACTURING THE SAME

CROSS-REFERENCE TO RELATED APPLICATION

This application claims priority to French patent application number 16/61302, filed on Nov. 21, 2016, the content of which is hereby incorporated by reference in its entirety to the maximum extent allowable by law.

BACKGROUND

The present application relates to electronic circuits and to methods of manufacturing the same.

DISCUSSION OF THE RELATED ART

For certain applications, it is desirable to be able to form electrically conductive tracks based on the deposition of electrically-conductive ink, particularly ink containing silver, on a polymer substrate. An example of application concerns electronic circuits comprising antennas comprising a conductive track formed on a polymer substrate.

The forming of the conductive tracks generally comprises depositing patterns of the conductive ink in liquid or viscous form on the substrate and heating the conductive ink in order to obtain the conductive tracks. The electric conductivity of the conductive tracks obtained by this method is generally all the higher as the heating step, also called thermal anneal, has been carried out at a high temperature. However, when the heating step is carried out at a temperature higher than the glass transition temperature of the polymer forming the substrate, the partial penetration of the ink into the substrate and the partial penetration of the polymer forming the substrate into the conductive ink can be observed. A deformation of the ink patterns deposited on the substrate and the deformation of the substrate can further be observed. The performances of the conductive tracks are then generally strongly degraded.

There exist polymers having a high glass transition temperature such as for example poly(4,4'-oxydiphenylene-pyromellitimide), better known as Kapton, and having a glass transition temperature in the order of 400° C. However, the use of such materials cannot be envisaged for many applications, particularly for cost reasons.

Some polymers, such as polycarbonate (PC), have thermal, mechanical, and optical properties which make them advantageous for a use as electronic circuit substrates. However, such materials may have a glass transition temperature lower than 200° C., particularly lower than 150° C. It is then not possible to carry out a heating step after the deposition of conductive ink on such a substrate at a temperature sufficiently high to obtain conductive tracks having a high electric conductivity.

It would thus be desirable to use a polymer substrate having a glass transition temperature lower than 200° C. and having conductive tracks formed thereon by deposition of conductive ink and heating of the conductive ink at a temperature higher than or equal to the glass transition temperature of the polymer.

SUMMARY

An object of an embodiment is to overcome all or part of the disadvantages of electronic circuits comprising a polymer substrate and electrically-conductive tracks on the substrate and of their previously-described manufacturing methods.

Another object of an embodiment is for the glass transition temperature of the polymer to be lower than 200° C.

Another object of an embodiment is for the conductive tracks to be formed by deposition of conductive ink and heating of the conductive ink to a temperature greater than or equal to 200° C.

Another object of an embodiment is for the conductive tracks to be formed by printing techniques.

Another object of an embodiment is for the electronic circuit to be manufactured with a decreased cost.

Thus, an embodiment provides an electronic circuit comprising:

a substrate made of a first polymer having a first glass transition temperature lower than 200° C., the substrate having first and second opposite surfaces;

a first layer or first tracks of a second polymer on the first surface;

a second layer or second tracks of the second polymer or of a third polymer on the second surface, the second and third polymers being different from the first polymer and having a second glass transition temperature higher than 200° C.; and third electrically-conductive tracks on the first layer or the first tracks.

According to an embodiment, the first polymer is selected from the group comprising polycarbonate (PC), poly(ethylene terephthalate) (PET), poly(ethylene naphthalate) (PEN), styrenic polymers (particularly, the styrene acrylonitrile (SAN) copolymer, acrylate styrene acrylonitrile (ASA), and acrylonitrile butadiene styrene (ABS)), polymethyl methacrylate (PMMA), thermoplastic polyurethanes (TPU, particularly polyester-based TPU, polyether-based TPU), polyvinylidene fluoride (PVDF), polyvinyl resins (particularly polyvinyl acetate (PVAC), polyvinyl alcohol (PVAL), polyvinyl formal (PVFM), and polyvinyl butyral (PVB)), ethylene chlorotrifluoroethylene copolymer (ECTFE), polypropylenes (PP), and a mixture of at least two of these compounds.

According to an embodiment, the thickness of the substrate is in the range from 30 μm to 300 μm.

According to an embodiment, the second and third polymers are selected from the group comprising polyimides, polybenzimidazole (PBI), polyetherimide (PEI), polyamide-imide (PAI), polyethersulfone (PES), and a mixture of at least two of these compounds.

According to an embodiment, the substrate, the first layer or the first tracks and/or the second layer or the second tracks further comprise a mineral pigment, an organic pigment, or a dye.

According to an embodiment, the thickness of the first layer, of the first tracks, of the second layer, and/or of the second tracks is in the range from 10 nm to 300 nm.

According to an embodiment, the thickness of the first layer, of the first tracks, of the second layer, and/or of the second tracks is in the range from 10 μm to 25 μm.

According to an embodiment, the thickness of the third tracks is in the range from 500 nm to 25 μm.

According to an embodiment, the first tracks and/or the second tracks comprise parallel strips arranged with a pitch which is not constant.

An embodiment also provides a method of manufacturing an electronic circuit, comprising the steps of:

a) providing a substrate made of a first polymer having a first glass transition temperature lower than 200° C., the substrate having first and second opposite surfaces;

b) forming a first layer or first tracks of a second polymer on the first surface and a second layer or second tracks of the second polymer or of a third polymer on the second surface, the second and third polymers being different from the first polymer and having a second glass transition temperature higher than 200° C.; and c) forming third electrically-conductive tracks on the first layer or the first tracks.

According to an embodiment, step c) successively comprises depositing conductive ink on the first layer or the first tracks and drying the ink at a temperature higher than the first glass transition temperature.

The foregoing and other features and advantages will be discussed in detail in the following non-limiting description of specific embodiments in connection with the accompanying drawings.

DETAILED DESCRIPTION

Figure 1:
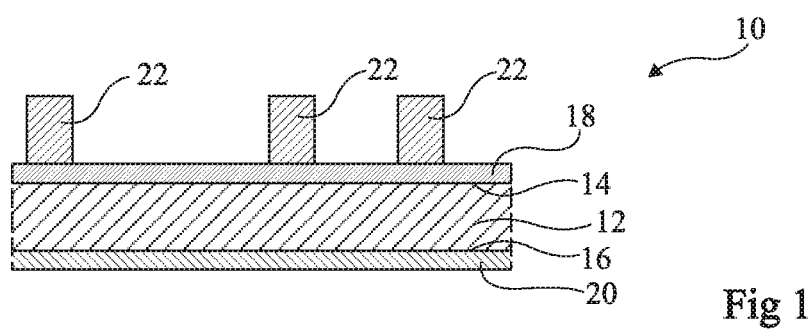
FIGS. 1 to 4 are partial simplified cross-section views of embodiments of an electronic circuit.

The same elements have been designated with the same reference numerals in the different drawings. For clarity, only those steps and elements which are useful to the understanding of the described embodiments have been shown and are detailed. Unless otherwise specified, expressions "approximately", "substantially", "about", and "in the order of" mean to within 10%, preferably to within 5%.

In the following description, "electrically-insulating material" or "dielectric material" designates a material having an electric resistivity greater than $10^5$ Ω·m and "electrically-conductive material" designates a material having an electric resistivity smaller than 0.1 Ω·m.

FIG. 1 is a partial simplified cross-section view of an embodiment of an electronic circuit 10. Circuit 10 comprises a substrate 12 made of a first polymer comprising two opposite surfaces 14, 16, for example, substantially planar. Circuit 10 further comprises a layer or film 18 made of a second polymer, different from the first polymer, on surface 14, preferably in contact with surface 14, and a layer of film 20 of the second polymer or of a third polymer, different form the first polymer and from the second polymer, on surface 16, preferably in contact with surface 16. Circuit 10 further comprises electrically-conductive tracks 22 on layer 18, preferably in contact with layer 18.

The first polymer has a glass transition temperature lower than 200° C., preferably lower than 150° C. According to an embodiment, the first polymer is selected from the group comprising polycarbonate (PC), poly(ethylene terephthalate) (PET), poly(ethylene naphthalate) (PEN), styrenic polymers (particularly, the styrene acrylonitrile (SAN) copolymer, acrylate styrene acrylonitrile (ASA) and acrylonitrile butadiene styrene (ABS)), polymethyl methacrylate (PMMA), thermoplastic polyurethanes (TPU, particularly polyester-based TPU, polyether-based TPU), polyvinylidene fluoride (PVDF), polyvinyl resins (particularly polyvinyl acetate (PVAC), polyvinyl alcohol (PVAL), polyvinyl formal (PVFM), and poly(vinyl butyral) (PVB)), ethylene chlorotrifluoroethylene copolymer (ECTFE), polypropylenes (PP), and a mixture of at least two of these compounds.

The thickness of substrate 12 is in the range from 30 µm to 300 µm.

The second and third polymers have a glass transition temperature greater than 200° C. According to an embodiment, the second and third polymers are selected from the group comprising polyimide (PI), polybenzimidazole (PBI), polyetherimide (PEI), polyamide-imide (PAI), polyethersulfone (PES), and a mixture of at least two of these compounds. The thickness of layer 18 and/or the thickness of layer 20 depend on the desired application. If it is mainly desired to protect substrate 12 against the penetration of the ink used to form conductive tracks 22, the thickness of layer 18 and/or the thickness of layer 20 may be smaller than 1 µm, for example, in the range from 10 nm to 300 nm. If it is desired to decrease the deformations of substrate 12 during the manufacturing of electronic circuit 10, the thickness of layer 18 and/or the thickness of layer 20 may be greater than 10 µm, for example, in the range from 10 µm to 25 µm.

These polymers may be combined with a mineral pigment (for example, titanium dioxide, nickel titanate, chromium titanate, iron oxide, chromium oxide, cobalt aluminate, carbon black), an organic pigment (particularly azoic compounds, phthalocyanines, thio-indigoids, quinacridones, dioxazine, perylene, anthraquinones), or a dye (particularly an anthraquinonic derivative, with a metal complex), according to the original polymer, to further obtain a decorative and/or masking aspect.

Conductive tracks 22 are formed by deposition and then heating of electrically-conductive ink. The electrically-conductive ink particularly contains a solvent having electrically-conductive particles dispersed therein. The electrically-conductive particles are preferably metal particles or nanowires made of a material selected from the group comprising silver, copper, gold, nickel, aluminum, carbon, or particles made of a conductive polymer (for example, PEDOT:PSS or poly-aniline). The thickness of conductive tracks 22 after the heating operation is for example in the range from 500 nm to 25 µm.

Figure 2:
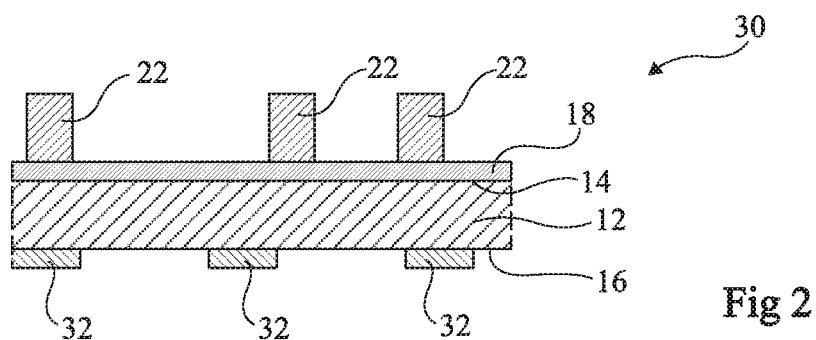

FIG. 2 is a partial simplified cross-section view of another embodiment of an electronic circuit 30. Electronic circuit 30 comprises all the elements of electronic circuit 10 shown in FIG. 1, with the difference that layer 20 is replaced with tracks 32 of the second polymer or of the third polymer on surface 16 of substrate 12, preferably in contact with surface 16 of substrate 12. Tracks 32 may be separate or contiguous.

The thickness of tracks 32 is in the range from 10 nm to 300 nm. Tracks 32 may correspond to strips, particularly arranged parallel to one another or in a grid. Tracks 32 may correspond to a single track, for example, extending in a spiral on surface 16. The maximum spacing between two adjacent tracks 32 is in the range from 150 µm to 200 µm.

According to an embodiment, tracks 32 may be arranged substantially periodically on surface 16. According to another embodiment, tracks 32 may be arranged on surface 16 with a variable pitch, for example in the form of parallel strips having a smaller pitch at the center of surface 16, the pitch increasing as the distance from the center of surface 16 increases, to reach a maximum value at the edges of surface 16 parallel to tracks 32. According to another embodiment, the width of tracks 32 may be variable, tracks 32 being for example arranged in the form of parallel strips having a smaller width at the center of surface 16, the width increasing as the distance from the center of surface 16 increases, to reach a maximum value at the edges of surface 16 parallel to tracks 32. According to another embodiment, both the pitch and the width of tracks 52 may be variable. As an example, at the center of surface 16, the pitch of tracks 32 may be approximately 50 µm, which for example corresponds to a spacing between adjacent tracks of 30 µm for a 20-µm width of tracks 32, and at the level of the edges of surface 16 parallel to tracks 32, the pitch may be from 300 µm to 400 µm, which for example corresponds to a spacing from 100 µm to 200 µm for a 200-µm width of tracks 32. Such an arrangement enables to improve the distribution of the mechanical stress across the entire substrate 10, particularly when defects are present in substrate 10.

Figure 3:
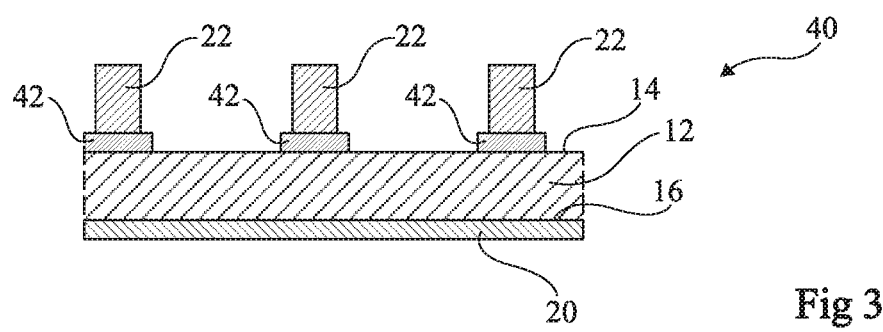

FIG. 3 is a partial simplified cross-section view of another embodiment of an electronic circuit 40. Electronic circuit 40 comprises all the elements of electronic circuit 10 shown in FIG. 1, with the difference that layer 18 is replaced with tracks 42 of the second polymer on surface 14 of substrate 12, preferably in contact with surface 14 of substrate 12. Tracks 42 may be separate or contiguous. Conductive tracks 22 rest on tracks 42. Preferably, the shape of tracks 42 may follow that of conductive tracks 22. The thickness of tracks 42 may be the same as that of layer 18.

Figure 4:
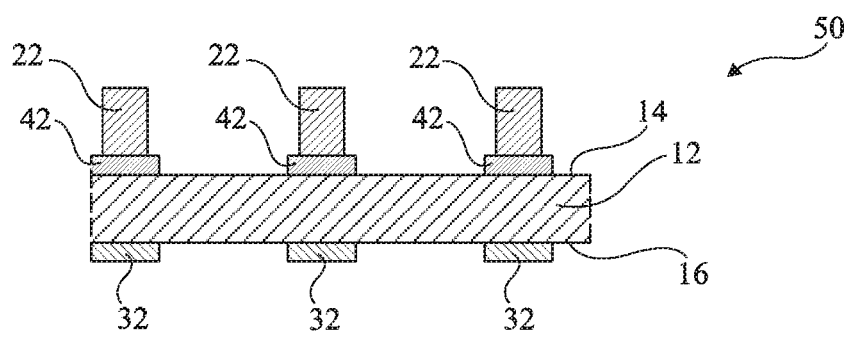

FIG. 4 is a partial simplified cross-section view of another embodiment of an electronic circuit 50. Electronic circuit 50 comprises all the elements of electronic circuit 10 shown in FIG. 1, with the difference that layer 18 is replaced with tracks 42 of the second polymer on surface 14 of substrate 12, preferably in contact with surface 14 of substrate 12, as for electronic circuit 40 shown in FIG. 3. Further, layer 20 is replaced with tracks 32 of the second polymer or of the third polymer on surface 16 of substrate 12, preferably in contact with surface 16 of substrate 12, preferably in contact with surface 16 of substrate 12, as for electronic circuit 30 shown in FIG. 3.

FIGS. 5A to 5D are partial simplified cross-section views of structures obtained at successive steps of another embodiment of a method of manufacturing electronic circuit 10 of FIG. 1.

Figure 5A:
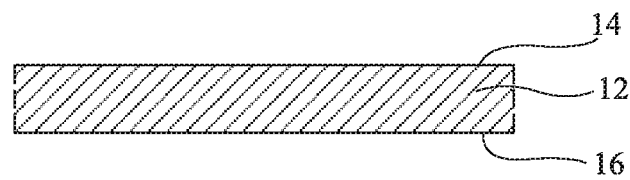
FIGS. 5A to 5D are partial simplified cross-section views of structures obtained at successive steps of an embodiment of a method of manufacturing the electronic circuit of FIG. 1.

FIG. 5A shows the structure obtained after the forming of substrate 12 of the first polymer, for example, polycarbonate. A step of heating substrate 12, for example, at 80° C. for 12 hours, may be provided.

Figure 5B:
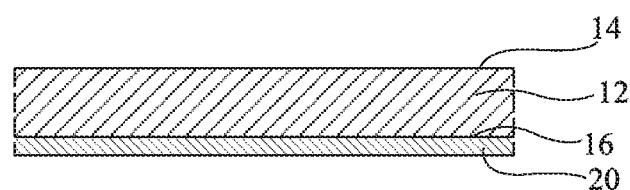

FIG. 5B shows the structure obtained after the forming of layer 20 on surface 16 of substrate 12. Layer 20 may be formed by deposition of the second polymer or of the third polymer on surface 16 and the heating of the obtained structure at a temperature lower than the glass transition temperature of the first polymer, for example, at 100° C. for 15 minutes when the first polymer is polyacrylate. The deposition may correspond to a deposition by inkjet printing, photogravure, silk-screening, flexography, spray coating, or drop casting, or a liquid deposition, by cathode sputtering or by evaporation. Methods such as spin coating, spray coating, slot-die coating, or blade coating, may in particular be used.

Figure 5C:
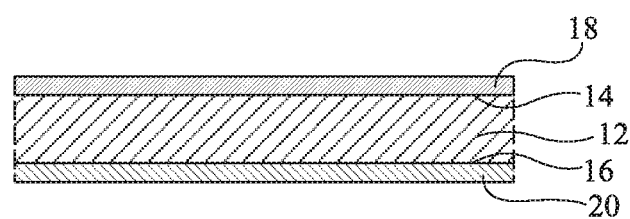

FIG. 5C shows the structure obtained after the forming of layer 18 on surface 14 of substrate 12. Layer 18 may be formed by deposition of the second polymer on surface 14 and the heating of the obtained structure at a temperature lower than the glass transition temperature of the first polymer, for example, at 100° C. for 15 minutes when the first polymer is polyacrylate. The methods previously described for the deposition of layer 20 may also be implemented for the deposition of layer 18.

Figure 5D:
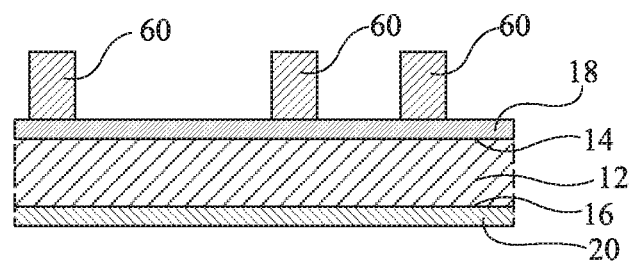

FIG. 5D shows the structure obtained after the forming of patterns 60 made of conductive ink at the desired locations of conductive tracks 22. The method of forming patterns 60 of the conductive ink may correspond to a so-called additive method, for example, by direct printing of the conductive ink at the desired locations, for example, by inkjet printing, photogravure, silk-screening, flexography, spray coating, or drop casting. The method of forming patterns 60 of the conductive ink may correspond to a so-called subtractive method, where the conductive ink is deposited all over the structure and where the portions which have not been used are then removed, for example, by photolithography or laser ablation. According to the considered material, the deposition over the entire structure may be performed, for example, by liquid deposition, by cathode sputtering, or by evaporation. Methods such as spin coating, spray coating, heliography, slot-die coating, blade coating, flexography, or silk-screening, may in particular be used.

The conductive ink comprises metal particles dispersed in a solvent. Advantageously, the presence of layer 18 enables to use inks having a solvent which may be non-compatible with the first polymer. In the case where the first polymer is polycarbonate, examples of solvents which are compatible with polycarbonate are water, ethanol, and isopropanol. In the case where the first polymer is polycarbonate, examples of solvents which are not compatible with polycarbonate are cyclopentanone, toluene, ethylene glycol, and butylacetate.

The method further comprises a step of heating the obtained structure at a temperature higher than the glass transition temperature of the first polymer, for example, 150° C., for 30 minutes when the first polymer is polyacrylate. The structure shown in FIG. 1 is then obtained.

The inventors have shown that the presence of layer 18 enables to prevent, during the step of heating at a temperature greater than the glass transition temperature of the first polymer, the conductive ink from mixing with the first polymer. Further, the presence of layers 18 and 20 enables to prevent substrate 12 from deforming during the step of heating at a temperature higher than the glass transition temperature of the first polymer.

FIGS. 6A to 6D are partial simplified cross-section views of structures obtained at successive steps of another embodiment of a method of manufacturing electronic circuit 30 of FIG. 2.

Figure 6A:
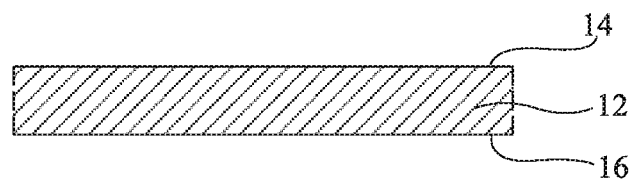
FIGS. 6A to 6D are partial simplified cross-section views of structures obtained at successive steps of an embodiment of a method of manufacturing the electronic circuit of FIG. 2.

FIG. 6A shows the structure obtained after the forming of substrate 12 of the first polymer, for example, polycarbonate.

Figure 6B:
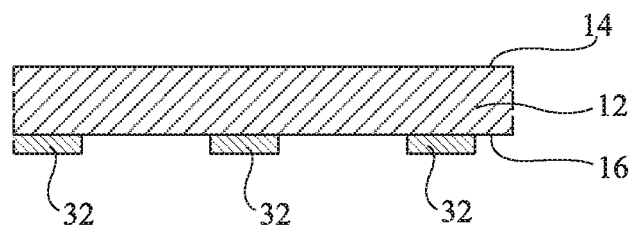

FIG. 6B shows the structure obtained after the forming of tracks 32 on surface 16 of substrate 12. Tracks 32 may be formed by deposition of the second polymer or of the third polymer on surface 16 and heating of the obtained structure at a temperature lower than the glass transition temperature of the first polymer. The methods of depositing the second polymer or the third polymer on surface 16 are the methods previously-described in relation with FIG. 5D for the deposition of patterns 60.

Figure 6C:
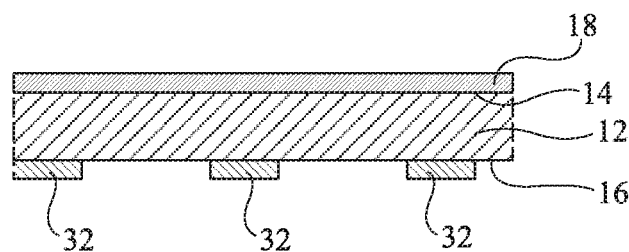

FIG. 6C shows the structure obtained after the forming of layer 18 on surface 14 of substrate 12. Layer 18 may be formed as previously described in relation with FIG. 5C.

Figure 6D:
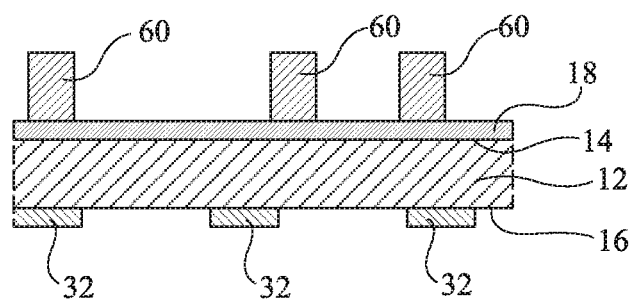

FIG. 6D shows the structure obtained after the forming of patterns 60 made of conductive ink at the desired locations of conductive tracks 22, as previously described in relation with FIG. 5D.

The method further comprises a step of heating the structure obtained at step 6D at a temperature higher than the glass transition temperature of the first polymer. The structure shown in FIG. 2 is then obtained.

Tests have been performed. First electronic circuits having the structure shown in FIG. 1 have been manufactured, with the difference that layers 18 and 20 were not present. Substrate 12 was polycarbonate and had a 175-µm thickness. Conductive tracks 22 were formed from the silver ink commercialized by Novacentrix under trade name Metalon HPS-021LV. A thermal anneal has been carried out in an infrared furnace for 30 minutes at 150° C. Second electronic circuits have been manufactured. The second electronic circuits had the same structure as the first electronic circuits and further comprised polyimide layers 18 and 20 having a thickness in the range from 10 nm to 400 nm.

The resistances expressed in ohm per square of the conductive tracks 22 of the first and second circuits have been measured. The results are gathered in the following table I:

TABLE I

| Anneal temperature (° C.) | Resistance (ohm per square) Second circuits | Resistance (ohm per square) First circuits |
|---|---|---|
| 100 | 40 | 40 |
| 125 | 23 | 23 |
| 145 | 19 | 2000 |
| 175 | 15 | >2000 |
| 200 | 13 | >2000 |

When layers 18 and 20 are present, a decrease in the resistance of conductive tracks 22 can be observed when the anneal temperature increases, while when layers 18 and 20 are not present, an increase in the resistance of conductive tracks 22 can be observed when the anneal temperature increases.

Further, the inventors have shown that when layers 18 and 20 of electronic circuit 10 shown in FIG. 1, layer 18 and tracks 32 of electronic circuit 30 shown in FIG. 2, tracks 42 and layer 20 of electronic circuit 40 shown in FIG. 3 or tracks 42 and tracks 32 of electronic circuit 50 shown in FIG. 4 are present, a decrease in the deformations of substrate 12 can be observed.

Simulations have been performed. Each simulation has been carried out with a substrate corresponding to a rectangular polycarbonate sheet of 320 mm by 380 mm with a 175-µm thickness, having a surface covered with a layer of the polyimide commercialized by Nissan Chemical Industries under trade name Sunever series 2 SE 7492 and having a 20-µm thickness. A thermal anneal at 150° C. for from 30 minutes to 60 minutes has been carried out. The substrate was embedded on an edge, the opposite edge being left free.

In a first simulation, the surface of the substrate opposite to the surface covered with the polyimide layer was left free. A maximum 17-µm deflection with respect to a horizontal plane towards the surface having the polyimide layer resting thereon is obtained.

In a second simulation, the surface of the substrate opposite to the surface covered with the polyimide layer was covered with parallel strips of polyimide PI-7492 with a thickness varying from 5 µm to 10 µm and a pitch from 150 µm to 200 µm and a 100-µm width. A maximum 13-µm deflection with respect to a horizontal plane towards the surface having the polyimide layer resting thereon is obtained. A decrease in the maximum deflection has thus been obtained.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronic circuit comprising:
   a substrate made of a first polymer having a first glass transition temperature lower than 150° C., the substrate having first and second opposite surfaces;
   a first layer or first tracks of a second polymer on the first surface;
   a second layer or second tracks of the second polymer or of a third polymer on the second surface, the second and third polymers being different from the first polymer and having a second glass transition temperature higher than 200° C.; and
   third electrically-conductive tracks on the first layer or the first tracks; wherein:
   the first polymer is selected from the group comprising polycarbonate, poly(ethylene terephthalate) (PET), poly(ethylene naphthalate) (PEN), styrenic polymers (particularly, the styrene acrylonitrile (SAN) copolymer, acrylate styrene acrylonitrile (ASA), and acrylonitrile butadiene styrene (ABS)), polymethyl methacrylate (PMMA), thermoplastic polyurethanes (TPU, particularly polyester-based TPU, polyether-based TPU), polyvinylidene fluoride (PVDF), polyvinyl resins (particularly polyvinyl acetate (PVAC), polyvinyl alcohol (PVAL), polyvinyl formal (PVFM), and polyvinyl butyral (PVB)), ethylene chlorotrifluoro-ethylene copolymer (ECTFE), polypropylenes (PP), and a mixture of at least two of these compounds; and
   the second and third polymers are selected from the group comprising polyimides, polybenzimidazole (PBI), polyether-imide (PEI), polyamide-imide (PAI), polyethersulfone (PES), and a mixture of at least two of these compounds.

2. The electronic circuit of claim 1, wherein the thickness of the substrate is in the range from 30 µm to 300 µm.

3. The electronic circuit of claim 1, wherein the substrate, the first layer or the first tracks, and/or the second layer or the second tracks further comprise a mineral pigment, an organic pigment, or a dye.

4. The electronic circuit of claim 1, wherein the thickness of the first layer, of the first tracks, of the second layer, and/or of the second tracks is in the range from 10 nm to 300 nm.

5. The electronic circuit of claim 1, wherein the thickness of the first layer, of the first tracks, of the second layer, and/or of the second tracks is in the range from 10 µm to 25 µm.

6. The electronic circuit of claim 1, wherein the thickness of the third tracks is in the range from 500 nm to 25 µm.

7. The electronic circuit of claim 1, wherein the first tracks and/or the second tracks comprise parallel strips arranged with a pitch which is not constant.

* * * * *